United States Patent
Wu et al.

(10) Patent No.: US 11,862,714 B2
(45) Date of Patent: *Jan. 2, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Jiun Shiung Wu, Pingtung County (TW); Guan-Jie Shen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 103 days.

This patent is subject to a terminal disclaimer.

(21) Appl. No.: 17/397,646

(22) Filed: Aug. 9, 2021

(65) Prior Publication Data

US 2021/0376115 A1 Dec. 2, 2021

Related U.S. Application Data

(63) Continuation of application No. 16/681,506, filed on Nov. 12, 2019, now Pat. No. 11,121,238.

(Continued)

(51) Int. Cl.
*H01L 29/66* (2006.01)
*H01L 29/06* (2006.01)
(Continued)

(52) U.S. Cl.
CPC ...... *H01L 29/6681* (2013.01); *H01L 29/0657* (2013.01); *H01L 29/16* (2013.01)

(58) Field of Classification Search
CPC . H01L 29/6681; H01L 29/0657; H01L 29/16; H01L 29/7853; H01L 29/7854;
(Continued)

(56) References Cited

U.S. PATENT DOCUMENTS 8,470,714 B1 * 6/2013 Tsai ............... H01L 29/66795
438/699
10,115,823 B2 10/2018 Ching et al.
(Continued)

FOREIGN PATENT DOCUMENTS

CN 106057672 A 10/2016
CN 106328589 A 1/2017
(Continued)

OTHER PUBLICATIONS

Non-Final Office Action issued in U.S. Appl. No. 16/681,506, dated Nov. 27, 2020.
(Continued)

*Primary Examiner* — Herve-Louis Y Assouman
(74) *Attorney, Agent, or Firm* — Studebaker & Brackett PC

(57) ABSTRACT

In a method of manufacturing a semiconductor device, a fin structure having a bottom part and an upper part on the bottom part is formed over a substrate. The bottom part is trimmed so that a width of an uppermost portion of the bottom part is smaller than a width of the upper part. Bottom end corners of the upper part are trimmed to reduce a width of the upper part at a bottom of the upper part. An isolation insulating layer is formed so that the upper part protrudes from the isolation insulating layer. A dummy gate structure is formed. A source/drain structure is formed. An interlayer dielectric layer is formed over the dummy gate structure and the source/drain structure. The dummy gate structure is replaced with a metal gate structure.

20 Claims, 8 Drawing Sheets

Related U.S. Application Data

(60) Provisional application No. 62/773,086, filed on Nov. 29, 2018.

(51) Int. Cl.
  *H01L 29/16* (2006.01)
  *H01L 29/78* (2006.01)
  *H01L 21/768* (2006.01)
  *H01L 29/417* (2006.01)

(58) Field of Classification Search
  CPC ............. H01L 29/66795; H01L 29/785; H01L 21/30604; H01L 21/3065; H01L 21/76811; H01L 21/76816; H01L 29/41725; H01L 29/41791; H01L 29/66545
  See application file for complete search history.

(56) References Cited

U.S. PATENT DOCUMENTS

| | | | |
|---|---|---|---|
| 11,121,238 B2* | 9/2021 | Wu | ............... H01L 29/0657 |
| 2007/0205459 A1 | 9/2007 | Cho et al. | |
| 2008/0230832 A1 | 9/2008 | Cho | |
| 2011/0097889 A1 | 4/2011 | Yuan et al. | |
| 2011/0220964 A1 | 9/2011 | Shin et al. | |
| 2012/0086053 A1* | 4/2012 | Tseng | ............... H01L 29/7853 |
| | | | 438/424 |
| 2013/0221448 A1 | 8/2013 | Chang et al. | |
| 2014/0217517 A1* | 8/2014 | Cai | ............... H01L 29/458 |
| | | | 438/586 |
| 2014/0252489 A1 | 9/2014 | Yu et al. | |
| 2015/0380525 A1* | 12/2015 | Yu | ............... H01L 27/10879 |
| | | | 257/192 |
| 2016/0027684 A1 | 1/2016 | Chang et al. | |
| 2017/0005002 A1 | 1/2017 | Ching et al. | |
| 2018/0151564 A1 | 5/2018 | Lee et al. | |
| 2018/0151739 A1* | 5/2018 | Liang | ............... H01L 29/7853 |
| 2018/0175173 A1 | 6/2018 | Chang et al. | |

FOREIGN PATENT DOCUMENTS

| | | |
|---|---|---|
| KR | 10-2007-0090375 A | 9/2007 |
| KR | 100858882 B1 | 9/2008 |
| KR | 10-2011-0103158 A | 9/2011 |
| KR | 10-2013-0099779 A | 9/2013 |
| KR | 10-2017-0003347 A | 1/2017 |
| KR | 10-2018-0060909 A | 6/2018 |
| TW | 201701358 A | 1/2017 |
| TW | 201807822 A | 3/2018 |
| TW | 201830491 A | 8/2018 |

OTHER PUBLICATIONS

Notice of Allowance issued in U.S. Appl. No. 16/681,506, dated Apr. 6, 2021.

* cited by examiner

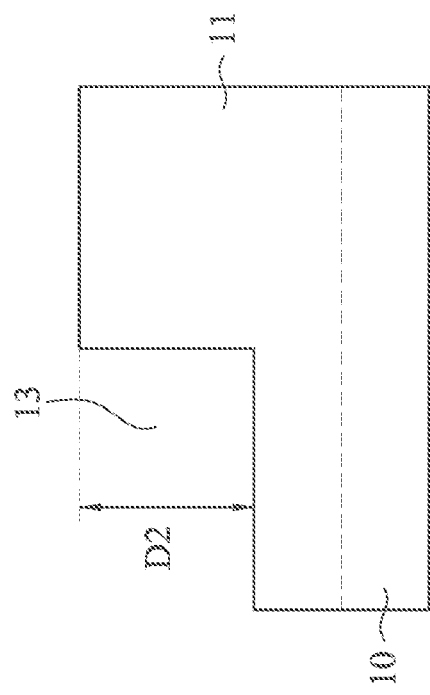
FIG. 1
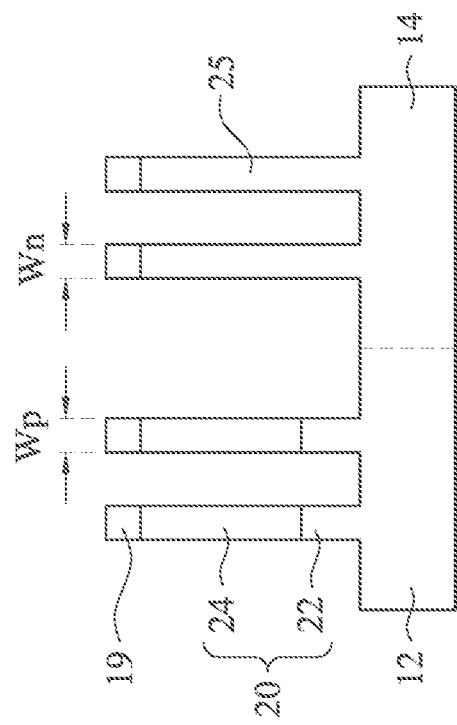
FIG. 2
FIG. 3
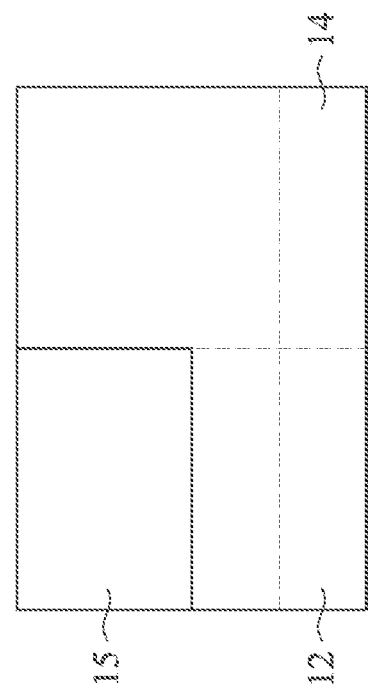
FIG. 4

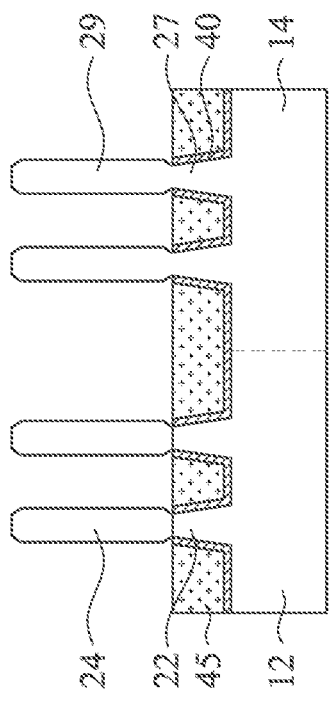
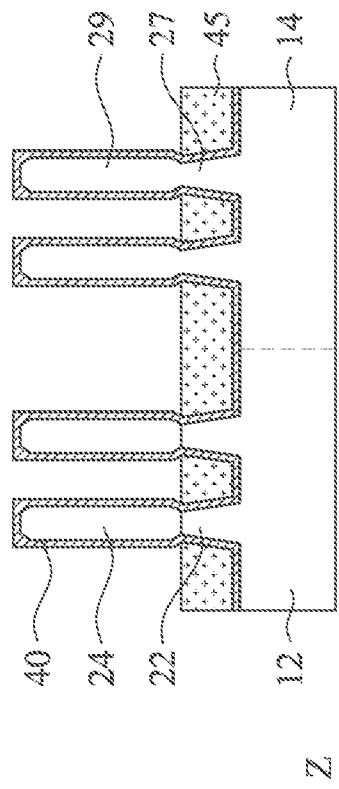
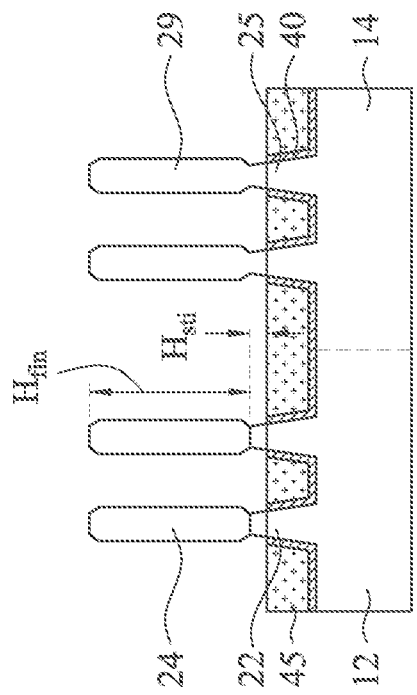

SEMICONDUCTOR DEVICE AND MANUFACTURING METHOD THEREOF

RERATED APPLICATIONS

This application is a continuation of U.S. patent application Ser. No. 16/681,506 filed Nov. 12, 2019, which claims priority to U.S. Provisional Patent Application No. 62/773,086 filed Nov. 29, 2018, the entire content of each of which is incorporated herein by reference.

BACKGROUND

In a fin field-effect transistor (FinFET), current leakage in a region below a channel region of the FinFET in a bottom portion of a fin structure should be prevented or suppressed. To reduce current leakage, a silicon-on-insulator (SOI) substrate, which is much more expensive than a traditional silicon substrate, may be used such that a buried oxide layer of the SOI substrate can be used to isolate the source and drain regions. Alternatively, a punch-through stopper or an oxide layer may be buried below the channel region so as to increase resistivity thereof, thereby reducing current leakage. However, forming a punch-through stopper below the channel region and forming an oxide layer below the channel region are complicated and difficult to control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 shows a cross sectional view of one of the various stages of a sequential manufacturing operation of a fin field-effect transistor (FinFET) according to an embodiment of the present disclosure.

FIG. 2 shows a cross sectional view of one of the various stages of a sequential manufacturing operation of a fin field-effect transistor (FinFET) according to an embodiment of the present disclosure.

FIG. 3 shows a cross sectional view of one of the various stages of a sequential manufacturing operation of a fin field-effect transistor (FinFET) according to an embodiment of the present disclosure.

FIG. 4 shows a cross sectional view of one of the various stages of a sequential manufacturing operation of a fin field-effect transistor (FinFET) according to an embodiment of the present disclosure.

FIG. 13 shows a cross sectional view of one of the various stages of a sequential manufacturing operation of a fin field-effect transistor (FinFET) according to an embodiment of the present disclosure.

FIG. 14 shows a cross sectional view of one of the various stages of a sequential manufacturing operation of a fin field-effect transistor (FinFET) according to an embodiment of the present disclosure.

FIG. 15 shows a cross sectional view of one of the various stages of a sequential manufacturing operation of a fin field-effect transistor (FinFET) according to an embodiment of the present disclosure.

DETAILED DESCRIPTION

Figure 6:
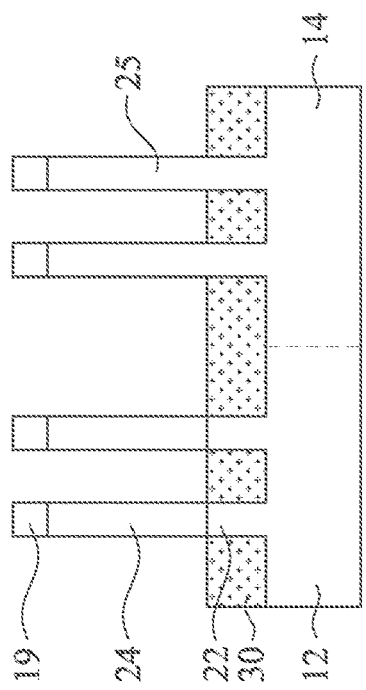
FIG. 6 shows a cross sectional view of one of the various stages of a sequential manufacturing operation of a fin field-effect transistor (FinFET) according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain.

FIGS. 1-21 show various stages for a sequential manufacturing process of a Fin FET device according to embodiments of the present disclosure. It is understood that in the sequential manufacturing process, one or more additional operations can be provided before, during, and after the stages shown in FIGS. 1-21, and some of the operations described below can be replaced or eliminated for additional embodiments of the method. The order of the operations/processes may be interchangeable.

FIG. 1 shows a cross sectional view of one of the various stages of a sequential manufacturing operation of a fin field-effect transistor (FinFET) according to an embodiment of the present disclosure.

As shown in FIG. 1, a first semiconductor layer 11 is epitaxially formed over a substrate 10. The substrate 10 can be a semiconductor substrate formed of, for example, one of Si, Ge, SiGe, SiC, SiP, SiPC, InP, InAs, GaAs, AlInAs, InGaP, InGaAs, GaAsSb, GaPN, AlPN, and any other suitable material. In certain embodiments, a crystalline Si substrate is used as the substrate 10.

The first epitaxial semiconductor layer 11 is the same semiconductor as the substrate 10 in some embodiments. In certain embodiments, the substrate 10 and the first epitaxial semiconductor layer 11 are both Si. In other embodiments, the first epitaxial semiconductor layer 11 is made of $Si_{1-x}Ge_x$, where $0<x<0.2$, and the substrate 10 is Si. In some embodiments, a thickness D1 of the first epitaxial semiconductor layer 11 is in a range from about 20 nm to about 200 nm, and is in a range from 50 nm to about 100 nm in other embodiments.

The first epitaxial semiconductor layer 11 can be formed by an epitaxial growth method using chemical vapor deposition (CVD), atomic layer deposition (ALD) or molecular beam epitaxy (MBE). In some embodiments, the first epitaxial semiconductor layer is appropriately doped with impurities, such as P, As, In and/or B.

In some embodiments, no first epitaxial layer 11 is formed over the substrate 10.

FIG. 2 shows a cross sectional view of one of the various stages of a sequential manufacturing operation of a fin field-effect transistor (FinFET) according to an embodiment of the present disclosure.

After the first epitaxial 11 is formed, a part of the first epitaxial semiconductor layer 11 is recessed by one of more lithography and etching operations. In some embodiments, the depth D2 of the recess 13 is in a range from about 10 nm to about 200 nm, and is in a range from 30 nm to about 120 nm in other embodiments. In some embodiments, the depth D2 of the recess 13 is smaller than the thickness of the first epitaxial semiconductor layer 11 and thus the recess 13 does not reach the semiconductor substrate 10. In other embodiments, the recess 13 penetrates into the semiconductor substrate 10, and thus the depth D2 of the recess 13 is greater than the thickness of the first epitaxial semiconductor layer 11. In certain embodiments, the recess etching stops at the surface of the semiconductor substrate 10. When no first epitaxial semiconductor is formed, a part of the substrate 10 is patterned to form the recess 13.

FIG. 3 shows a cross sectional view of one of the various stages of a sequential manufacturing operation of a fin field-effect transistor (FinFET) according to an embodiment of the present disclosure.

After the recess 13 is formed, a second semiconductor layer 15 is epitaxially formed in the recess 13. In some embodiments, the second epitaxial semiconductor 15 is made of $Si_{1-y}Ge_y$, where $0.15 \leq y \leq 0.85$, and in other embodiments, $0.3 \leq y \leq 0.6$. The second epitaxial semiconductor layer 15 can be formed by an epitaxial growth method using chemical vapor deposition (CVD), atomic layer deposition (ALD) or molecular beam epitaxy (MBE). In some embodiments, a chemical mechanical polishing (CMP) operation is performed to remove excess portion of the second epitaxial semiconductor layer grown over the upper surface of the first epitaxial semiconductor layer 11. In some embodiments, the second epitaxial semiconductor layer 15 is made of Ge, a Group-IV compound semiconductor (e.g., SiC, SiGeSn, SiSn and GeSn) or a Group III-V compound semiconductor (e.g., InP, InAs, GaAs, AlInAs, GaN, InGaN, AlGaN, InGaP, InGaAs and GaAsSb).

In some embodiments, the first epitaxial layer 11, the second epitaxial layer 15 and/or the substrate 10 are appropriately doped with impurities to form one or more wells. In some embodiments, an n-type well 12 is formed in and/or below the second epitaxial layer 15 (in the first epitaxial layer 11 and/or the substrate 10) for a p-type FET, and a p-type well 14 is formed in and/or below the first epitaxial layer 11 (and in the substrate 10) for an n-type FET, as shown in FIG. 3. The wells can be formed before or after the second epitaxial layer 15 is formed.

FIG. 4 shows a cross sectional view of one of the various stages of a sequential manufacturing operation of a fin field-effect transistor (FinFET) according to an embodiment of the present disclosure. As shown in FIG. 4, fin structures are formed.

In some embodiments, a hard mask layer including one or more of a $SiO_2$ layer, a $Si_3N_4$ layer, and a SiON layer is formed on the first epitaxial layer 11 and the second epitaxial layer 15. Then, the hard mask layer is patterned into a mask pattern 19 by using one or more lithography and etching operations. Further, the first and second epitaxial layers are trench etched by using plasma etching with the mask pattern 19 as an etching mask. Etching gases include one or more $CF_4$, $SF_6$, $CH_2F_2$, HBr, $Cl_2$, and/or $O_2$ at pressure from about 10 mTorr to about 200 mTorr, source power from about 300 W to about 1000 W, and bias power from about 500 W to about 2000 W, in some embodiments.

In some embodiments, the fin structures may be patterned by other suitable methods. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In some embodiments, fin structures 20 including a bottom fin structure 22 and an upper fin structure 24 are formed over the n-type well 12, and fin structures 25 are formed over the p-type well 14. Although FIG. 4 shows two fin structures for one or more p-type FETs over the n-type well 12 and two fin structures for one or more n-type FETs over the p-type well 14, the numbers of the fin structures are not limited to two.

The widths Wp of the fin structure 20 is in a range from about 5 nm to about 40 nm in some embodiments, and is in a range from about 10 nm to about 25 nm in other embodiments. The widths Wn of the fin structure 25 is in a range from about 5 nm to about 40 nm in some embodiments, and is in a range from about 10 nm to about 25 nm in other embodiments. In some embodiments, Wp=Wn. In other embodiments, Wp<Wn, which can improve controllability of drain-induced barrier lowering (DIBL). In other embodiments, Wp>Wn, which can enhance carrier mobility in the p-type FET.

Figure 5:
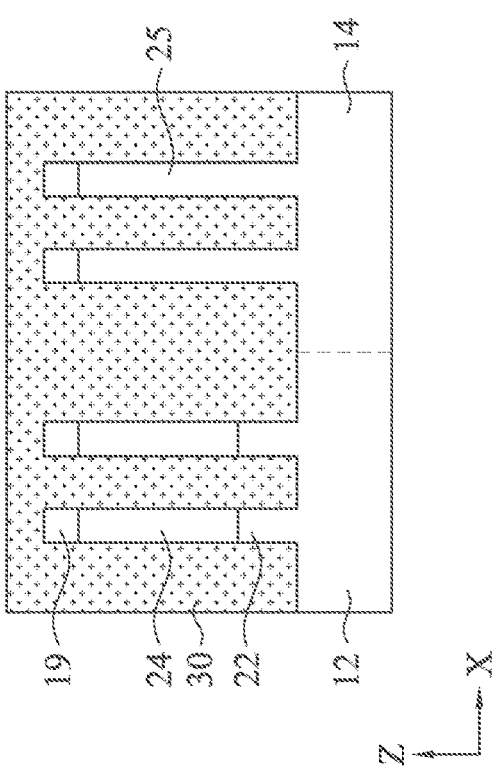
FIG. 5 shows a cross sectional view of one of the various stages of a sequential manufacturing operation of a fin field-effect transistor (FinFET) according to an embodiment of the present disclosure.

FIG. 5 shows a cross sectional view of one of the various stages of a sequential manufacturing operation of a fin field-effect transistor (FinFET) according to an embodiment of the present disclosure.

After the fin structures 20 and 25 are formed, a sacrificial layer 30 is formed over the fin structures so that the fin structures are fully embedded in the sacrificial layer 30, as shown in FIG. 5. In some embodiment, the sacrificial layer 30 includes one or more layers of insulating material, such as silicon oxide, silicon nitride, silicon oxynitride (SiON), SiOCN, fluorine-doped silicate glass (FSG), or a low-K dielectric material, formed by LPCVD (low pressure chemical vapor deposition), plasma-CVD or flowable CVD. An anneal operation may be performed after the formation of the sacrificial layer 30. In some embodiments, the sacrificial layer is amorphous silicon.

FIG. 6 shows a cross sectional view of one of the various stages of a sequential manufacturing operation of a fin field-effect transistor (FinFET) according to an embodiment of the present disclosure.

An etch-back operation is performed to reduce the height of the sacrificial layer 30, as shown in FIG. 6. In some embodiments, the reduced height of the sacrificial layer 30 is equal to the level of the interface between the bottom fin structure 22 and the upper fin structure 24. In other embodiments, the reduced height of the sacrificial layer 30 is lower or higher than the level of the interface between the bottom fin structure 22 and the upper fin structure 24.

Figure 7:
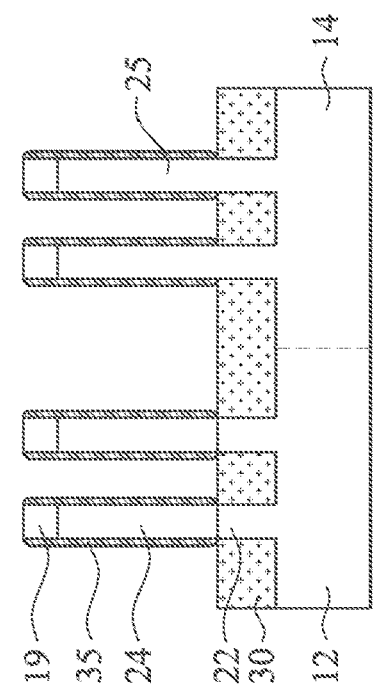
FIG. 7 shows a cross sectional view of one of the various stages of a sequential manufacturing operation of a fin field-effect transistor (FinFET) according to an embodiment of the present disclosure.

FIG. 7 shows a cross sectional view of one of the various stages of a sequential manufacturing operation of a fin field-effect transistor (FinFET) according to an embodiment of the present disclosure.

A cover layer 35 is conformally formed over the exposed fin structures 20 and 25. The cover layer 35 is made of a different material than the sacrificial layer, and includes silicon nitride or SiON in some embodiments. In some embodiments, anisotropic etching is performed to remove the cover layer formed on the upper surface of the sacrificial layer 30, as shown in FIG. 7.

Figure 8:
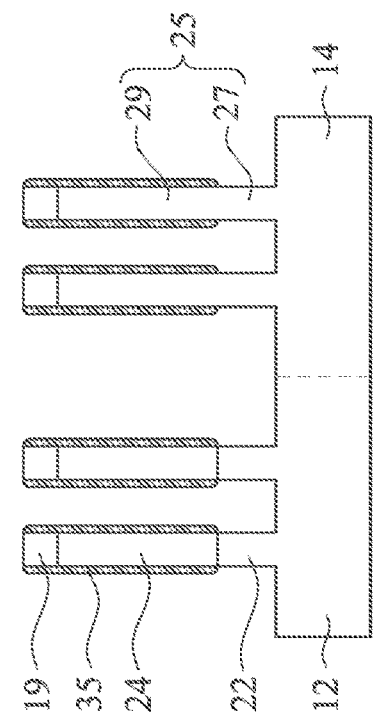
FIG. 8 shows a cross sectional view of one of the various stages of a sequential manufacturing operation of a fin field-effect transistor (FinFET) according to an embodiment of the present disclosure.

FIG. 8 shows a cross sectional view of one of the various stages of a sequential manufacturing operation of a fin field-effect transistor (FinFET) according to an embodiment of the present disclosure.

After the cover layer 35 is formed, the sacrificial layer 30 is removed. As shown in FIG. 8, the exposed portion of the fin structure 25 is a bottom fin structure 27 and a portion covered by the cover layer 35 of the fin structure 25 is an upper fin structure 29.

Figure 9:
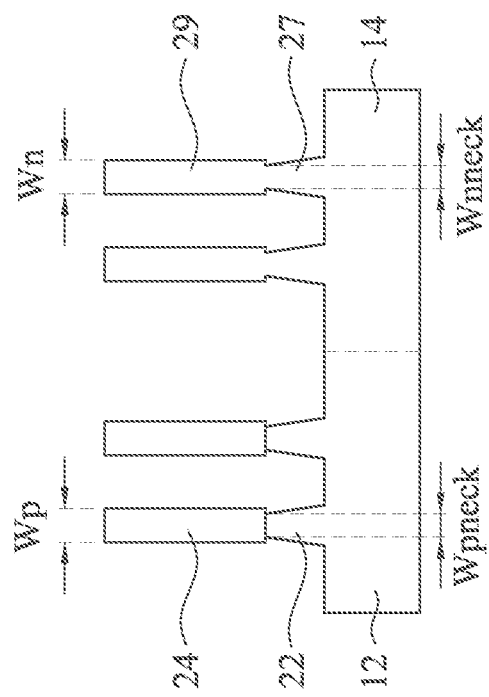
FIG. 9 shows a cross sectional view of one of the various stages of a sequential manufacturing operation of a fin field-effect transistor (FinFET) according to an embodiment of the present disclosure.

FIG. 9 shows a cross sectional view of one of the various stages of a sequential manufacturing operation of a fin field-effect transistor (FinFET) according to an embodiment of the present disclosure.

After the sacrificial layer 30 is removed, the bottom fin structures 22 and 27 are trimmed by a suitable etching operation. In some embodiments, one or more dry etching operations are performed to reduce the width of the bottom fin structures 22 and 27. In other embodiments, a wet etching operation using HF and $O_3$ water is performed. As shown in FIG. 9, the etching is performed such that the bottom fin structures 22 and 27 have a tapered shape having a smallest width at the top. In some embodiments, the dry etching includes repeating an etching phase and a deposition phase, to obtain the tapered shape.

Figure 10:
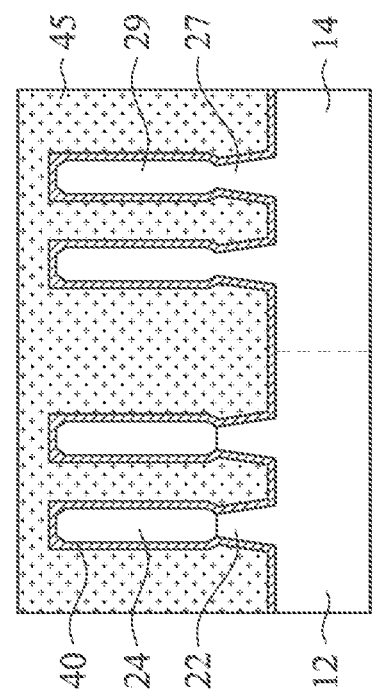
FIG. 10 shows a cross sectional view of one of the various stages of a sequential manufacturing operation of a fin field-effect transistor (FinFET) according to an embodiment of the present disclosure.

FIG. 10 shows a cross sectional view of one of the various stages of a sequential manufacturing operation of a fin field-effect transistor (FinFET) according to an embodiment of the present disclosure.

As shown in FIG. 10, the cover layer 35 is removed, thereby exposing the entire fin structures. In some embodiments, the bottom fin structure 22 has the smallest width Wpneck at the interface between the bottom fin structure 22 and the upper fin structure 24 ("neck portion"). In some embodiments, the width Wpneck of the neck portion is about 50% of Wp to about 95% of Wp. Similarly, the bottom fin structure 27 has the smallest width Wnneck at the level same as the interface between the bottom fin structure 22 and the upper fin structure 24 ("neck portion"). In some embodiments, the width Wnneck of the neck portion is about 50% of Wn to about 95% of Wn. In some embodiments, the hard mask patterns 19 are removed at this stage of the manufacturing operation.

Figure 11:
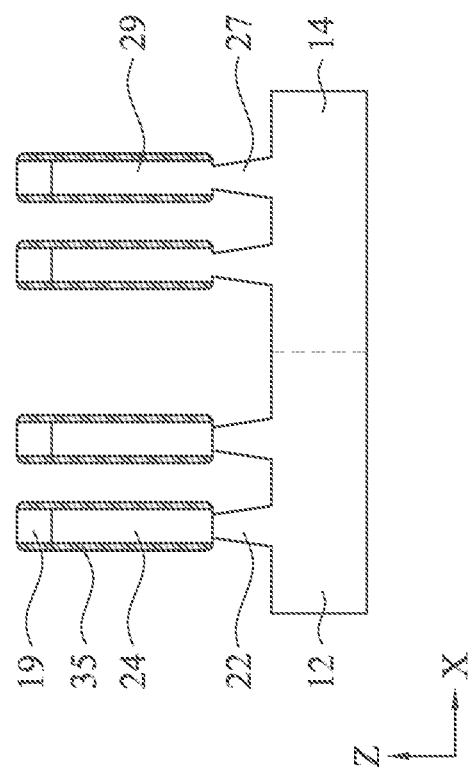
FIG. 11 shows a cross sectional view of one of the various stages of a sequential manufacturing operation of a fin field-effect transistor (FinFET) according to an embodiment of the present disclosure.

FIG. 11 shows a cross sectional view of one of the various stages of a sequential manufacturing operation of a fin field-effect transistor (FinFET) according to an embodiment of the present disclosure.

After the cover layer 35 is removed, corners of the upper fin structures 24 and 29 are trimmed to reduce a width of the upper fin structures near the interface between the upper fin structures and the bottom fin structures, as shown in FIG. 11. In some embodiments, a wet etching operation is performed. In some embodiments, an aqueous solution containing ammonia and hydrogen peroxide and/or an aqueous solution containing hydrochloric acid and hydrogen peroxide is used as the wet etchant. Since the corners having a sharp angle (e.g., 90 degrees) are more likely be etched than flat portion, the end corners are rounded or beveled. After the end corners of the upper part are trimmed, the end corners are rounded in some embodiments. In other embodiments, the end corners are beveled.

A dimension $H_{t1}$ of the trimmed portion 24B of the upper fin structure 24 is in a range from about 2 nm to about 10 nm in some embodiments. A dimension $H_{t2}$ of the trimmed portion 29B of the upper fin structure 29 is in a range from about 2 nm to about 10 nm in some embodiments. After the trimming operation, the fin structures 20 and 25 have the neck portion at or near the interface between the bottom fin structure and the upper fin structure, and the neck portion has the smallest width except for the top of the fin structures. In some embodiments, the neck portion is located below the center of the fin structure along the vertical direction.

In some embodiments, the height $H_{fin}$ of the upper fin structures 24 and 29 is in a range from about 20 nm to about 100 nm in some embodiments, and is in a range from about 30 nm to about 70 nm in other embodiments. In some embodiments, the height $H_{bot}$ of the bottom fin structures 22 and 27 is in a range from about 10 nm to about 80 nm in some embodiments, and is in a range from about 20 nm to about 50 nm in other embodiments. In some embodiments, the height $H_{bot}$ is smaller than the height $H_{fin}$, and in other embodiments, the height $H_{bot}$ is equal to or greater than the height $H_{fin}$. In some embodiments, the dimension $H_{t1}$ of the trimmed portion 24B or $H_{t2}$ of the trimmed portion 29B is about 5% to about 30% of the height $H_{fin}$ of the upper fin structures 24 and 29, and in other embodiments, is about 10% to about 20%.

Figure 12:
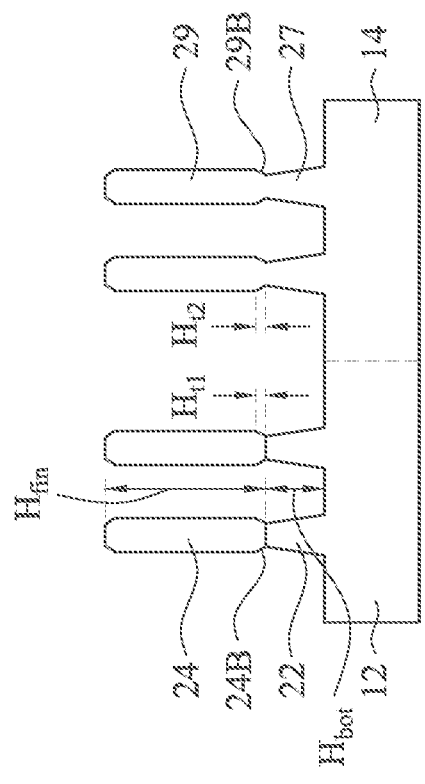
FIG. 12 shows a cross sectional view of one of the various stages of a sequential manufacturing operation of a fin field-effect transistor (FinFET) according to an embodiment of the present disclosure.

FIG. 12 shows a cross sectional view of one of the various stages of a sequential manufacturing operation of a fin field-effect transistor (FinFET) according to an embodiment of the present disclosure.

After the trimming operation, one or more fin liner layers 40 are formed, and an isolation insulating layer 45 is formed over the fin liner layer 40. In some embodiments, the fin liner layer 40 includes a first liner layer formed over the structures and a second liner layer formed over the first liner layer. The first liner layer is made of silicon oxide or a silicon oxide-based material and the second liner layer is made of SiN or a silicon nitride-based material. In some embodiments, the second liner layer is made of silicon oxide or a silicon oxide-based material and the first liner layer is made of SiN or a silicon nitride-based material. In some embodiments, only one of the first and second liner layers is formed.

The isolation insulating layer 45 (for shallow trench isolation, STI) includes one or more layers of insulating material. As show in FIG. 12, the isolation insulating layer 45 is formed so that the fin structures are fully embedded in the insulating layer. The insulating material for the insulating layer 45 may include silicon oxide, silicon nitride, silicon oxynitride (SiON), SiOCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer 45.

FIG. 13 shows a cross sectional view of one of the various stages of a sequential manufacturing operation of a fin field-effect transistor (FinFET) according to an embodiment of the present disclosure.

As shown in FIG. 13, the insulating layer 45 is recessed to partially expose an upper fin structures 24 and 29 covered by the fin liner layer 40. In some embodiments, the reduced height of the isolation insulating layer 45 is equal to the neck portion (the level of the interface between the bottom fin structure and the upper fin structure).

FIG. 14 shows a cross sectional view of one of the various stages of a sequential manufacturing operation of a fin field-effect transistor (FinFET) according to an embodiment of the present disclosure.

As shown in FIG. 14, the fin liner layer 40 is removed to expose the upper fin structures 24 and 29.

FIG. 15 shows a cross sectional view of one of the various stages of a sequential manufacturing operation of a fin field-effect transistor (FinFET) according to another embodiment of the present disclosure.

In some embodiments, the reduced height of the isolation insulating layer 45 is lower than the neck portion, as shown in FIG. 15. In other words, the upper surface of the isolation insulating layer 45 is located below the neck portion, thereby exposing the neck portion. In some embodiments, the distance Hsti between the neck portion and the upper surface of the isolation insulating layer 45 is in a range from about 0% of the height $H_{fin}$ of the upper fin structure to about 20% of the height $H_{fin}$.

Figure 16A:
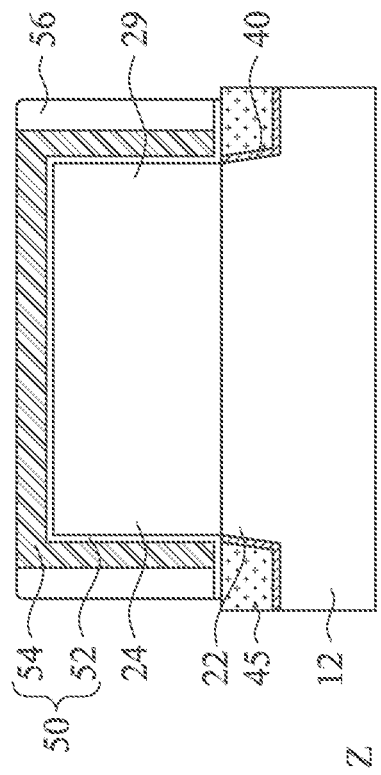
FIG. 16A shows a cross sectional view along a gate extending direction and FIG. 16B shows a cross sectional view along a fin extending direction of one of the various stages of a sequential manufacturing operation of a fin field-effect transistor (FinFET) according to an embodiment of the present disclosure.
Figure 16B:
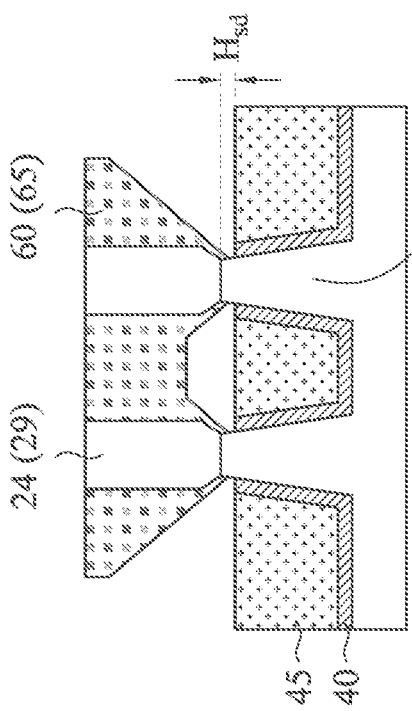

FIGS. 16A and 16B show a cross sectional view of one of the various stages of a sequential manufacturing operation of a fin field-effect transistor (FinFET) according to another embodiment of the present disclosure.

After the upper fin structures are exposed, sacrificial gate structures 50 are formed over the exposed upper fin structures, as shown in FIGS. 16A and 16B. The sacrificial gate structures 50 include a sacrificial gate dielectric layer 52 and a sacrificial gate electrode layer 54. The sacrificial gate structures 50 are formed by first blanket depositing a sacrificial gate dielectric layer 52 over the fin structures. The sacrificial gate dielectric layer 52 includes one or more layers of silicon oxide, silicon nitride or silicon oxynitride. The thickness of the sacrificial gate dielectric layer 52 is in a range from about 1 nm to about 5 nm in some embodiments. A sacrificial gate electrode layer 54 is then blanket deposited on the sacrificial gate dielectric layer 52 and over the fin structures, such that the fin structures are fully embedded in the sacrificial gate electrode layer 54. The sacrificial gate electrode layer 54 includes silicon such as poly crystalline silicon or amorphous silicon. The thickness of the sacrificial gate electrode layer 54 is in a range from about 100 nm to about 200 nm in some embodiments. In some embodiments, the sacrificial gate electrode layer 54 is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer 54. The mask layer includes a pad SiN layer and a silicon oxide mask layer in some embodiments. A patterning operation is performed on the mask layer, and the sacrificial gate electrode layer 54 is patterned into the sacrificial gate structures 50.

In an embodiment shown in FIGS. 16A and 16B, one sacrificial gate structure is formed over the two fin structures for a p-type FET, and one sacrificial gate structure is formed over the two fin structures for an n-type FET. However, the configuration of the sacrificial gate structures 50 is not limited to that of FIGS. 16A and 16B. The width of the sacrificial gate electrode layer 54 is in a range from about 5 nm to about 40 nm in some embodiments.

Further, after the sacrificial gate structures 50 are formed, a blanket layer of an insulating material for sidewall spacers 56 is conformally formed by using CVD or other suitable methods. The blanket layer is deposited in a conformal manner so that it is formed to have substantially equal thicknesses on vertical surfaces, such as the sidewalls, horizontal surfaces, and the top of the sacrificial gate structure. In some embodiments, the blanket layer is deposited to a thickness in a range from about 2 nm to about 10 nm. In one embodiment, the insulating material of the blanket layer is a silicon nitride-based material, such as SiN, SiON, SiOCN or SiCN and combinations thereof.

Then, as shown in FIGS. 16A and 16B, side wall spacers 56 are formed on opposite sidewalls of the sacrificial gate structures 50. After the blanket layer is formed, anisotropic etching is performed on the blanket layer using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. In some embodiments, isotropic etching is subsequently performed to remove the insulating material from the sidewalls of the exposed fin structures.

Figure 17:
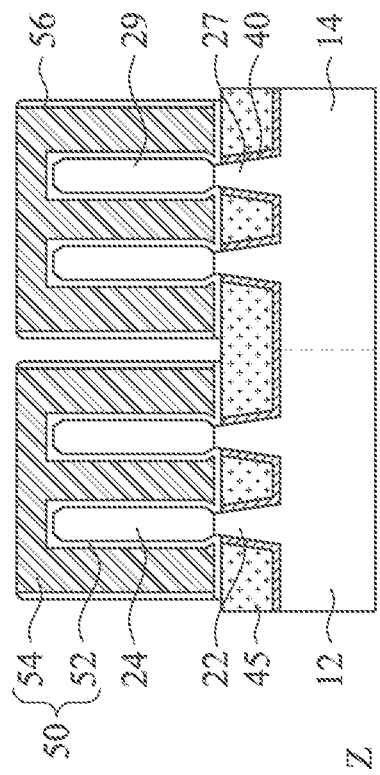
FIG. 17 shows a cross sectional view of one of the various stages of a sequential manufacturing operation of a fin field-effect transistor (FinFET) according to an embodiment of the present disclosure.
Figure 18:
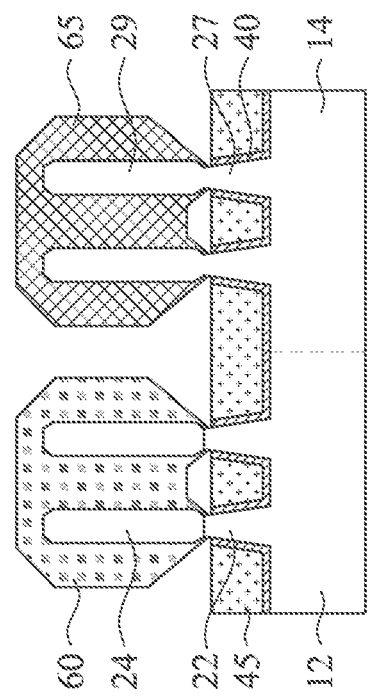
FIG. 18 shows a partial enlarged cross sectional view of FIG. 17.
Figure 19:
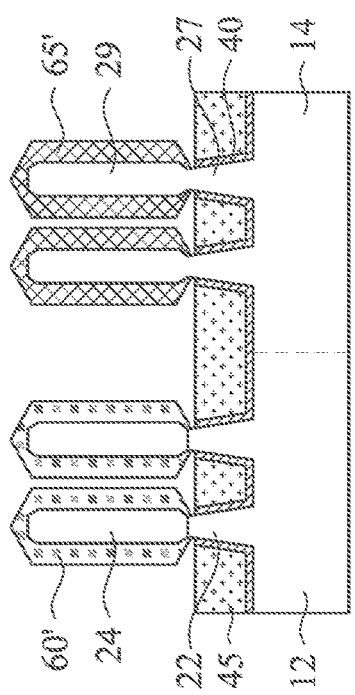
FIG. 19 shows a cross sectional view of one of the various stages of a sequential manufacturing operation of a fin field-effect transistor (FinFET) according to another embodiment of the present disclosure.

FIG. 17 shows a cross sectional view of one of the various stages of a sequential manufacturing operation of a fin field-effect transistor (FinFET) according to another embodiment of the present disclosure. FIG. 18 shows a partial enlarged cross sectional view of FIG. 17. FIG. 19 shows a cross sectional view of one of the various stages of a sequential manufacturing operation of a fin field-effect transistor (FinFET) according to another embodiment of the present disclosure.

After the sacrificial gate structures 50 are formed, a source/drain epitaxial layer 60 for a p-type FET and a source/drain epitaxial layer 65 for an n-type FET are formed over the source/drain regions of the upper fin structures 24 and 29, respectively. In some embodiments, the source/drain epitaxial layer 60 includes one or more layers of SiGe, Ge and GeSn. In some embodiments, the source/drain epitaxial layer 60 is doped with boron. In some embodiments, the source/drain epitaxial layer 65 includes one or more layers of SiP, SiC and SiCP. In some embodiments, the source/drain epitaxial layer 60 is doped with phosphorous and/or arsenic. The source/drain epitaxial layers are formed by an epitaxial growth method using CVD, ALD or molecular beam epitaxy (MBE). In some embodiments, the source/drain epitaxial layers 60 and 65 are a merged structure shared by two adjacent upper fin structures.

As shown in FIG. 18, the bottom of the epitaxial layers 60 and 65 is located at about ±10 nm from the neck portion in the vertical direction ($H_{sd}=\pm 10$ nm) in some embodiments. In some embodiments, the epitaxial growth of the epitaxial layer 60 (65) starts at the bottom fin structure 22 (27) and the epitaxial layer 60 (65) covers the neck portion ($H_{sd}>0$ nm). In other embodiments, the epitaxial growth of the epitaxial layer 60 (65) starts at the bottom of the upper fin structure 24 (29) and the neck portion is exposed from the epitaxial layer 60 (65) ($H_{sd}<0$ nm). In certain embodiments, the epitaxial growth of the epitaxial layer 60 (65) starts at the neck portion ($H_{sd}=0$ nm).

In other embodiments, as shown in FIG. 19, the source/drain epitaxial layers 60' and 65' are individually formed for each upper fin structure. In some embodiment, an n-type FET has a merged epitaxial source/drain structure as shown in FIG. 17, and a p-type FET has an individual epitaxial source/drain structure as shown in FIG. 19.

Figure 20:
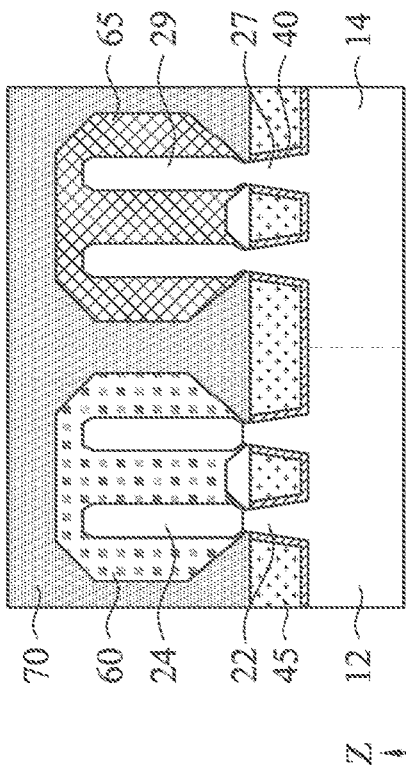
FIG. 20 shows a cross sectional view of one of the various stages of a sequential manufacturing operation of a fin field-effect transistor (FinFET) according to an embodiment of the present disclosure.

FIG. 20 shows a cross sectional view of one of the various stages of a sequential manufacturing operation of a fin field-effect transistor (FinFET) according to another embodiment of the present disclosure.

After the source/drain epitaxial layers are formed, one or more dielectric material layers are formed for an interlayer dielectric (ILD) layer 70. The materials for the ILD layer 70 may include compounds comprising Si, 0, C and/or H, such as SiCOH and SiOC. Organic material, such as polymers, may be used for the ILD layer 70. Further, in some embodiments, before forming the ILD layer 70, a silicon nitride layer as an etching stop layer may be formed over the source/drain epitaxial layers.

Figure 21:
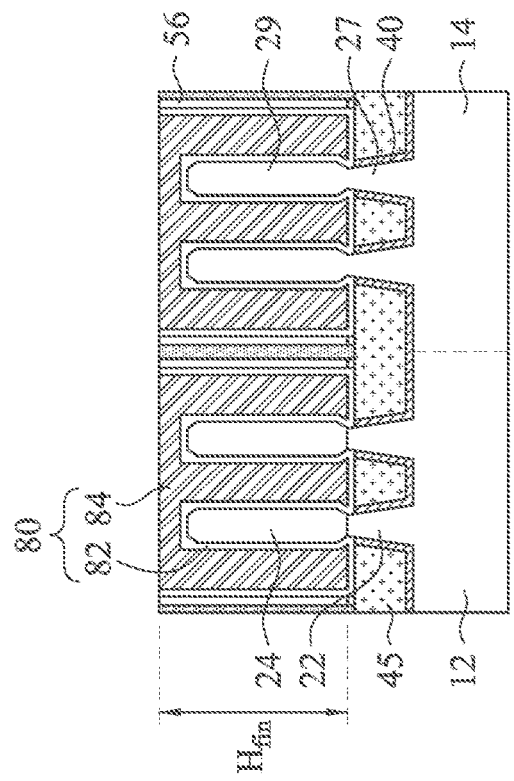
FIG. 21 shows a cross sectional view of one of the various stages of a sequential manufacturing operation of a fin field-effect transistor (FinFET) according to an embodiment of the present disclosure.

FIG. 21 shows a cross sectional view of one of the various stages of a sequential manufacturing operation of a fin field-effect transistor (FinFET) according to another embodiment of the present disclosure.

After the one or more layers of dielectric material layers for the ILD layer 70 are formed, a planarization operation, such as a CMP operation, is performed to expose the sacrificial gate electrode 54.

Further, the sacrificial gate structures 50 are replaced with metal gate structures 80. The sacrificial gate electrodes 54 and the sacrificial gate dielectric layers 52 are removed, thereby exposing the upper fin structures 24 and 29, which subsequently become channel regions. When the sacrificial gate electrode 54 is polysilicon, a wet etchant such as a TMAH solution can be used to selectively remove the sacrificial gate electrodes 54. The sacrificial gate dielectric layer 52 is thereafter removed using plasma dry etching and/or wet etching.

The metal gate structures 80 includes a high-k gate dielectric layer 82, one or more layers of work function adjustment material (not shown) and a body gate electrode layer 84 in some embodiments. In some embodiments, an interfacial layer including a silicon oxide layer is formed before the gate dielectric layer 82 is formed. In some embodiments, the gate dielectric layer 82 includes one or more layers of a dielectric material, such as, silicon nitride, $HfO_2$, $La_2O_3$, $ZrO_2$, $BaO$, $TiO_2$, $Ta_2O_5$, $SrO$, $Y_2O_3$, $HfSiO_4$, $ZrSiO_4$, $Al_2O_3$, $MgO$, $CaO$, other suitable high-k dielectric materials, and/or combinations thereof.

The gate dielectric layer 82 may be formed from CVD, ALD or any suitable method. In one embodiment, the gate dielectric layer is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

In some embodiments, one or more work function adjustment layers are formed on the gate dielectric layer 82. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the nFET, one or more of TaN, TaAlC, TiN, TiC, Co, TiAl, HfTi, TiSi and TaSi is used as the work function adjustment layer, and for the pFET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer 84 may be formed separately for the nFET and the pFET which may use different metal layers.

The body gate electrode layer 84 is formed to surround each channel region (nanowires). The body gate electrode layer 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The body gate electrode layer 84 may be formed from CVD, ALD, electro-plating, or other suitable method. The body gate electrode layer 84 is also deposited over the upper surface of the ILD layer. The materials for the metal gate structures 80 over the ILD layer are then planarized by using, for example, CMP, until the top surface of the ILD layer is revealed. In some embodiments, source/drain contacts are formed on the source/drain epitaxial layers 60 and 65, respectively. In some embodiments, one source/drain contact is provided on both the source/drain epitaxial layers 60 and 65. In certain embodiments, a contact connecting the gate electrode and the source/drain epitaxial layer is formed.

It is understood that the Fin FETs undergo further CMOS processes to form various features such as contacts/vias, interconnect metal layers, dielectric layers, passivation layers, etc.

Figure 22:
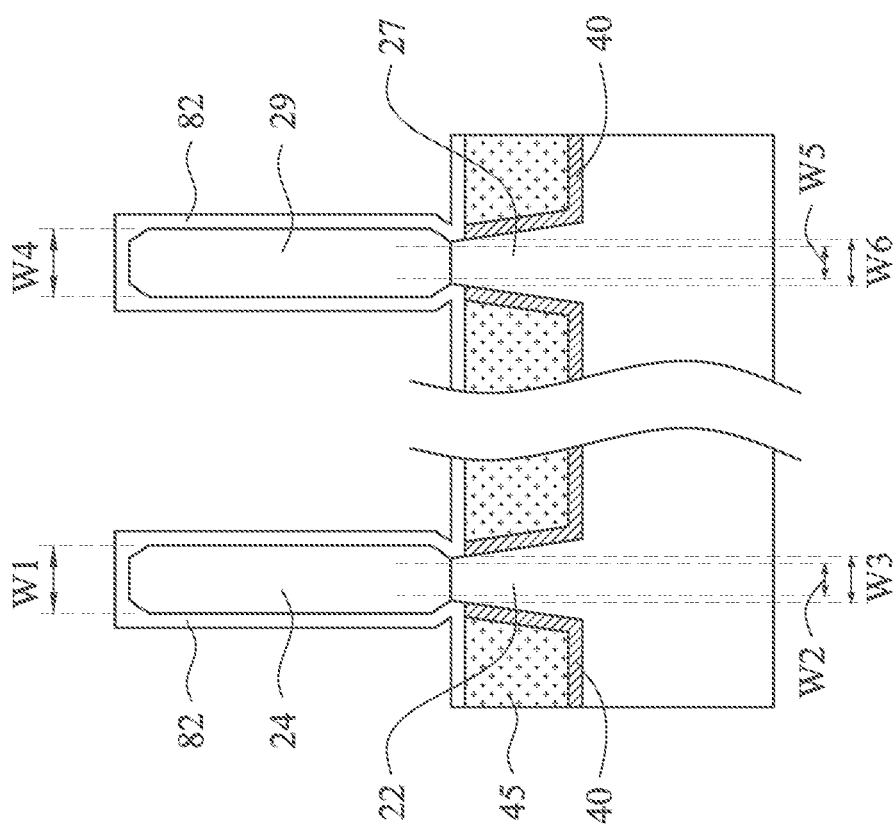
FIG. 22 shows enlarged cross sectional views of channel regions covered by a gate dielectric layer according to an embodiment of the present disclosure.

FIG. 22 shows enlarged cross sectional views of channel regions covered by a gate dielectric layer according to an embodiment of the present disclosure.

As shown in FIG. 22, the metal gate structure, in particular the gate dielectric layer 82 covers the neck portion in the fin structures. In some embodiments, the largest width W1 of the upper fin structure 24, the width W2 of the neck portion (the minimum width) and a width W3 of the bottom fin structure 22 at the level of the upper surface of the isolation insulating layer 45 satisfy W2<(W1+W3)/2. Similarly, in some embodiments, the largest width W4 of the upper fin structure 29, the width W5 of the neck portion (the minimum width) and a width W6 of the bottom fin structure 27 at the level of the upper surface of the isolation insulating layer 45 satisfy W5<(W4+W6)/2. In some embodiments, W2≥0.5W1, and W5≥0.5W4.

Figure 24:
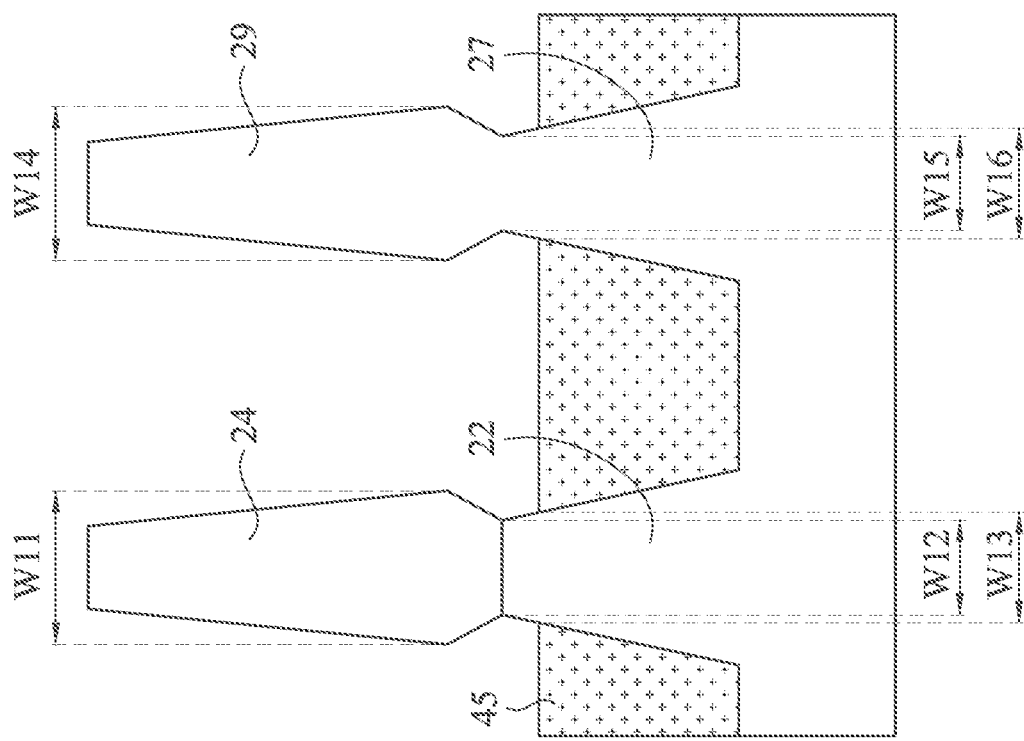
FIG. 24 shows a cross sectional view of one of the various stages of a sequential manufacturing operation of a fin field-effect transistor (FinFET) according to another embodiment of the present disclosure.
Figure 23:
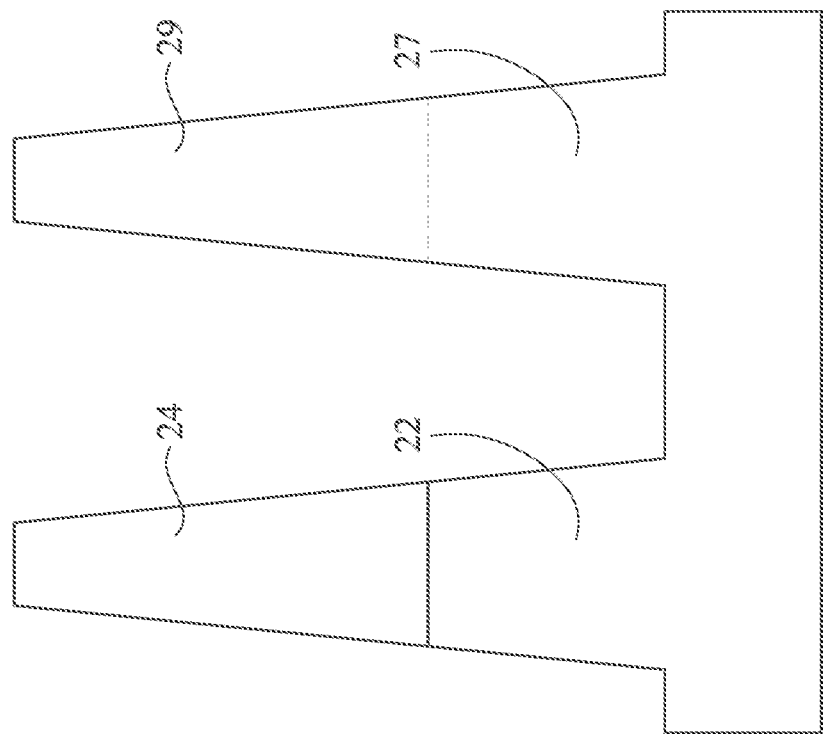
FIG. 23 shows a cross sectional view of one of the various stages of a sequential manufacturing operation of a fin field-effect transistor (FinFET) according to another embodiment of the present disclosure.

FIGS. 23 and 24 show cross sectional views of the various stages of a sequential manufacturing operation of a fin field-effect transistor (FinFET) according to another embodiment of the present disclosure. Materials, dimensions, configurations, processes, and/or operations as explained with the foregoing embodiments may be employed in the following embodiments, and detailed explanation thereof may be omitted.

In some embodiments, after patterning the fin structures 20 and 25, the fin structures 20 and 25 have a tapered shape, as shown in FIG. 23. After the trimming of the corners of the upper fin structures 24 and 29, the fin structures show the shapes shown in FIG. 24. In some embodiments, the largest width W11 of the upper fin structure 24, the width W12 of the neck portion (the minimum width) and a width W13 of the bottom fin structure 22 at the level of the upper surface of the isolation insulating layer 45 satisfy W12<(W11+W13)/2. Similarly, in some embodiments, the largest width W14 of the upper fin structure 29, the width W15 of the neck portion (the minimum width) and a width W16 of the bottom fin structure 27 at the level of the upper surface of the isolation insulating layer 45 satisfy W15<(W14+W16)/2. In some embodiments, W12≥0.5W11, and W15≥0.5W14.

The various embodiments or examples described herein offer several advantages over the existing art. For example, in the present disclosure, since the channel region has a neck portion having the smallest width (below the portion having the largest width), it is possible to effectively suppress off-leak current, without sacrificing transistor performance. Further, it is possible to improve controllability of drain-induced barrier lowering (DIBL).

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure having a bottom part and an upper part on the bottom part is formed over a substrate. The bottom part is trimmed so that a width of an uppermost portion of the bottom part is smaller than a width of the upper part. Bottom end corners of the upper part are trimmed to reduce a width of the upper part at a bottom of the upper part. An isolation insulating layer is formed so that the upper part protrudes from the isolation insulating layer. A dummy gate structure is formed. A source/drain structure is formed. An interlayer dielectric layer is formed over the dummy gate structure and the source/drain structure. The dummy gate structure is replaced with a metal gate structure. In one or more of the foregoing or the following embodiments, the upper part of the fin structure is made of a different semiconductor material than the bottom part of the fin structure. In one or more of the foregoing or the following embodiments, the upper part of the fin structure is made of SiGe and the bottom part of the fin structure is made of Si. In one or more of the foregoing or the following embodiments, after the bottom end corners of the upper part are trimmed, the bottom end corners are rounded or beveled. In one or more of the foregoing or the following embodiments, a portion having a minimum width of the fin structure, which is located below a portion having a largest width, is covered by the dummy gate structure. In one or more of the foregoing or the following embodiments, in the trimming the bottom end corners of the upper part, top end corners of the upper part are also trimmed. In one or more of the foregoing or the following embodiments, the trimming the bottom part is performed such that the bottom part has a tapered shape having a smallest width at a top. In one or more of the foregoing or the following embodiments, the isolation insulating layer is formed such that an upper surface of the isolation insulating layer is located below the interface between the bottom part and the upper part of the fin structure, and a height of the upper surface of the isolation insulating layer measured from the interface is from 0% to 20% of a vertical length of the upper part of the fin structure. In one or more of the foregoing or the following embodiments, before forming the isolation insulating layer, a fin liner layer is formed over the bottom part of the fin structure. In one or more of the foregoing or the following embodiments, the fin liner layer covers a bottom portion of the upper part of the fin structure after the inter layer dielectric layer is formed. In one or more of the foregoing or the following embodiments, the trimming the bottom part is performed while the upper part is covered by a mask layer. In one or more of the foregoing or the following embodiments, to form the mask layer, a sacrificial layer is formed over the fin structure, a height of the sacrificial layer is reduced so that the upper part of the fin structure is exposed, a layer for the mask layer is formed over the exposed upper part, and the sacrificial layer is removed so that the bottom part of the fin structure is exposed. In one or more of the foregoing or the following embodiments, the fin structure has a trapezoid shape having a largest width at a bottom.

In accordance with another aspect of the present disclosure, in a method of manufacturing a semiconductor device, an epitaxial semiconductor layer is formed over a semiconductor substrate. A fin structure is formed by patterning the epitaxial semiconductor layer and the semiconductor substrate, so that the fin structure has a bottom part corresponding to the semiconductor substrate and an upper part corresponding to the epitaxial semiconductor layer. The bottom part is trimmed so that a width of an uppermost portion of the bottom part is smaller than a width of the upper part. Bottom end corners of the upper part are trimmed to reduce a width of bottoms of the upper part. An isolation insulating layer is formed so that the upper part protrudes from the isolation insulating layer. A dummy gate structure is formed. A source/drain structure is formed. An interlayer dielectric layer is formed over the dummy gate structure and the source/drain structure. The dummy gate structure is replaced with a metal gate structure. In one or more of the foregoing or the following embodiments, the epitaxial semiconductor layer is made of a different semiconductor material than the semiconductor substrate. In one or more of the foregoing or the following embodiments, the epitaxial semiconductor layer is made of SiGe and the semiconductor substrate is made of Si. In one or more of the foregoing or the following embodiments, a portion having a minimum width of the fin structure, which is located below a portion having a largest width, is covered by the metal gate structure. In one or more of the foregoing or the following embodiments, the trimming the bottom part is performed such that the bottom part has a trapezoid shape having a smallest width at a top. In one or more of the foregoing or the following embodiments, a width W2 of the bottom part at the interface after the trimming the bottom part is 50% to 95% of a width W1 of the upper part at the interface before the trimming the bottom part.

In accordance with another aspect of the present disclosure, in a method of manufacturing a semiconductor device, an epitaxial semiconductor layer is formed over a recessed part of a semiconductor substrate. A first fin structure is formed by patterning the epitaxial semiconductor layer and the semiconductor substrate and a second fin structure by patterning the semiconductor substrate, so that the first fin structure has a bottom part corresponding to the semiconductor substrate and an upper part corresponding to the epitaxial semiconductor layer and the second fin structure has a bottom part and an upper part both corresponding to the semiconductor substrate. The bottom parts of first and second fin structures are trimmed so that a width of an uppermost portion of the bottom part is smaller than a width of the upper part in each of the first and second fin structures. Bottom end corners of the upper part are trimmed to reduce a width of a bottom of the upper part for each of the first and second fin structures. An isolation insulating layer is formed so that the upper part of each of the first and second fin structures protrudes from the isolation insulating layer. A dummy gate structure is formed over the first and second fin structures. A source/drain structure is formed. An interlayer dielectric layer is formed over the dummy gate structure and the source/drain structure. The dummy gate structure is replaced with a metal gate structure.

In accordance with another aspect of the present disclosure, a semiconductor device includes an isolation insulating layer disposed over a substrate, a fin structure having a bottom part and an upper part disposed over the substrate, the upper part protruding the isolation insulating layer, a gate structure disposed over the upper part of the fin structure, and a source/drain structure. The bottom part has a tapered shape and a bottom portion of the upper part has a reverse tapered shape. A portion having a minimum width of the fin structures, which is located below a portion having a largest width, is covered by a gate dielectric layer. In one or more of the foregoing or the following embodiments, the upper part of the fin structure is made of a different semiconductor material than the bottom part of the fin structure. In one or more of the foregoing or the following embodiments, the upper part of the fin structure is made of SiGe and the bottom part of the fin structure is made of Si. In one or more of the foregoing or the following embodiments, bottom end corners of the upper part are rounded. In one or more of the foregoing or the following embodiments, bottom end corners of the upper part are beveled. In one or more of the foregoing or the following embodiments, an upper surface of the isolation insulating layer is located below the interface between the bottom part and the upper part of the fin structure, and a height of the upper surface of the isolation insulating layer measured from the interface is from 0% to 20% of a vertical length of the upper part of the fin structure. In one or more of the foregoing or the following embodiments, the vertical length of the upper part is in a range from 30 nm to 70 nm. In one or more of the foregoing or the following embodiments, a width of the bottom part at an interface between the bottom part and the upper part of the fin structure is 50% to 95% of an average width of the upper part. In one or more of the foregoing or the following embodiments, the source/drain structure includes a source/drain fin structure and a source/drain epitaxial layer. In one or more of the foregoing or the following embodiments, a bottom of the source/drain epitaxial layer is within ±10 nm of an interface between the bottom part and the upper part of the fin structure. In one or more of the foregoing or the following embodiments, top end corners of the upper part are rounded. In one or more of the foregoing or the following embodiments, top end corners of the upper part are beveled.

In accordance with another aspect of the present disclosure, a semiconductor device includes an isolation insulating layer disposed over a substrate, a first fin structure and a second fin structure, each having a bottom part and an upper part disposed over the substrate, the upper part protruding the isolation insulating layer, a gate structure disposed over the upper part of each of the first and second fin structures, and a source/drain structure including a source/drain epitaxial layer. A largest width of the upper part of each of the first and second fin structures is located at a level above an interface between the upper part and the bottom part. A portion having a minimum width of each of the first and second fin structures, which is located below a portion having the largest width, is covered by a gate dielectric layer. In one or more of the foregoing or the following embodiments, the bottom part has a tapered shape and a bottom portion of the upper part has a reverse tapered shape. In one or more of the foregoing or the following embodiments, the upper part of the fin structure is made of a different semiconductor material than the bottom part of the fin structure. In one or more of the foregoing or the following embodiments, a height of an upper surface of the isolation insulating layer measured from an interface between the bottom part and the upper part of the fin structure is within 0% to 20% of a vertical length of the upper part of the fin structure. In one or more of the foregoing or the following embodiments, the vertical length of the upper part is in a range from 30 nm to 70 nm. In one or more of the foregoing or the following embodiments, the source/drain epitaxial layer is a merged structure covering the upper part of the first fin structure and the upper part of the second fin structure. In one or more of the foregoing or the following embodiments, a void is present between the isolation insulating layer and the source/drain epitaxial layer between the first and second fin structures.

In accordance with another aspect of the present disclosure, a semiconductor device includes an isolation insulating layer disposed over a substrate, a first fin structure and a second fin structure, each having a bottom part and an upper part disposed over the substrate, the upper part protruding the isolation insulating layer, a gate structure disposed over the upper part of each of the first and second fin structures, and a source/drain structure including a source/drain epitaxial layer. The upper part of the first fin structure is made of a different semiconductor material than the bottom part of the first fin structure. The upper part of the second fin structure is made of a same semiconductor material as the bottom part of the second fin structure. A largest width of the upper part of each of the first and second fin structures is located at a level above an interface between the upper part and the bottom part.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an isolation insulating layer disposed over a substrate;
   a fin structure having a bottom part and an upper part disposed over the substrate, the upper part protruding the isolation insulating layer;
   a gate structure disposed over the upper part of the fin structure;
   a source/drain structure, wherein:
   the upper part includes a bottom portion and an upper portion disposed on the bottom portion,
   the bottom part has a tapered shape and the bottom portion of the upper part has a reverse tapered shape,
   a portion having a minimum width of the fin structures, which is located below a portion having a largest width, is covered by a gate dielectric layer,
   the gate dielectric layer is in contact with the isolation insulating layer, and
   an entirety of the upper part of the fin structure including the bottom portion and the upper portion is made of a same semiconductor material, and is made of a different semiconductor material than the bottom part of the fin structure.

2. The semiconductor device of claim 1, wherein the upper part of the fin structure is made of SiGe and the bottom part of the fin structure is made of Si.

3. The semiconductor device of claim 1, wherein bottom end corners of the upper part are rounded.

4. The semiconductor device of claim 1, wherein bottom end corners of the upper part are beveled.

5. The semiconductor device of claim 1, wherein an upper surface of the isolation insulating layer is located below the interface between the bottom part and the upper part of the fin structure, and a height of the upper surface of the isolation insulating layer measured from the interface is from 0% to 20% of a vertical length of the upper part of the fin structure.

6. The semiconductor device of claim 5, wherein the vertical length of the upper part is in a range from 30 nm to 70 nm.

7. The semiconductor device of claim 1, wherein a width of the bottom part at an interface between the bottom part and the upper part of the fin structure is 50% to 95% of an average width of the upper part.

8. The semiconductor device of claim 1, wherein the source/drain structure includes a source/drain fin structure and a source/drain epitaxial layer.

9. The semiconductor device of claim 8, wherein a bottom of the source/drain epitaxial layer is within ±10 nm of an interface between the bottom part and the upper part of the fin structure.

10. The semiconductor device of claim 1, wherein top end corners of the upper part are rounded.

11. The semiconductor device of claim 1, wherein top end corners of the upper part are beveled.

12. A semiconductor device, comprising:
    an isolation insulating layer disposed over a substrate;
    a first fin structure and a second fin structure, each having a bottom part and an upper part disposed over the substrate, the upper part protruding the isolation insulating layer and including a bottom portion and an upper portion disposed on the bottom portion;
    a gate structure disposed over and covering the upper part of each of the first and second fin structures;
    a source/drain structure including a source/drain epitaxial layer, wherein:
    the bottom portion and the upper portion are continuous and made of a same material,
    a largest width of the upper part of each of the first and second fin structures is located at a level above an interface between the upper part and the bottom part,
    a portion having a minimum width of each of the first and second fin structures, which is located below a portion having the largest width, is covered by a gate dielectric layer, and
    the gate dielectric layer is in contact with the isolation insulating layer.

13. The semiconductor device of claim 12, wherein the bottom part has a tapered shape and the bottom portion of the upper part has a reverse tapered shape.

14. The semiconductor device of claim 12, wherein the upper part of the fin structure is made of a different semiconductor material than the bottom part of the fin structure.

15. The semiconductor device of claim 12, wherein a height of an upper surface of the isolation insulating layer measured from an interface between the bottom part and the upper part of the fin structure is within 0% to 20% of a vertical length of the upper part of the fin structure.

16. The semiconductor device of claim 15, wherein the vertical length of the upper part is in a range from 30 nm to 70 nm.

17. The semiconductor device of claim 12, wherein the source/drain epitaxial layer is a merged structure covering the upper part of the first fin structure and the upper part of the second fin structure.

18. The semiconductor device of claim 17, wherein a void is present between the isolation insulating layer and the source/drain epitaxial layer between the first and second fin structures.

19. A method of manufacturing a semiconductor device, the method comprising:

forming a semiconductor layer over a semiconductor substrate;
forming a fin structure by patterning the semiconductor layer and the semiconductor substrate using a dielectric hard mask pattern, so that the fin structure has a bottom part corresponding to the semiconductor substrate and an upper part corresponding to the semiconductor layer;
trimming the bottom part so that a width of the bottom part is smaller than a width of the upper part;
trimming bottom end corners of the upper part to reduce a width of a bottom of the upper part; and
after the trimming the bottom end corners, forming an isolation insulating layer so that the upper part protrudes from the isolation insulating layer.

20. The method of claim 19, wherein the semiconductor layer includes SiGe and the semiconductor substrate is a Si substrate.

\* \* \* \* \*